United States Patent
Yasuda et al.

(10) Patent No.: US 8,114,500 B2
(45) Date of Patent: Feb. 14, 2012

(54) POLYIMIDE FILM AND METHOD OF MANUFACTURE THEREOF

(75) Inventors: Naofumi Yasuda, Aichi (JP); Hiroki Ishikawa, Aichi (JP); Hirokazu Yokoyama, Aichi (JP)

(73) Assignee: E. I. du Pont de Nemours and Company, Wilmington, DE (US)

( * ) Notice: Subject to any disclaimer, the term of this patent is extended or adjusted under 35 U.S.C. 154(b) by 260 days.

(21) Appl. No.: 12/609,702

(22) Filed: Oct. 30, 2009

(65) Prior Publication Data

US 2010/0129605 A1    May 27, 2010

(30) Foreign Application Priority Data

Nov. 27, 2008   (JP) ................................ 2008-302480

(51) Int. Cl.
*B32B 15/088* (2006.01)
*B29C 55/14* (2006.01)
*C08J 5/18* (2006.01)

(52) U.S. Cl. ........ 428/147; 427/337; 427/340; 977/773; 977/775

(58) Field of Classification Search ................... 428/147; 427/337, 340; 997/773, 775
See application file for complete search history.

(56) References Cited

U.S. PATENT DOCUMENTS 4,786,560 A    11/1988  Crocker

FOREIGN PATENT DOCUMENTS

| EP | 920976 | 2/2004 |
| JP | 62068852 | 3/1987 |
| JP | 1993 25295 | 2/1993 |
| JP | 06-192445 | * 7/1994 |
| JP | 2005 126707 | 5/2005 |
| JP | 2007-130767 | * 5/2007 |

OTHER PUBLICATIONS

Thomas Reuters on STN, RD 409026,19980510 (199827), Laser ablative polyimide film-contains polyimide slip additive particles.

* cited by examiner

*Primary Examiner* — Ana Woodward
(74) *Attorney, Agent, or Firm* — Traci L. Halerz

(57) ABSTRACT

The purpose of the present invention is to provide a polyimide film with excellent passage characteristic, especially in an automatic optical inspection system (AOI), not to mention running characteristic (easy slip characteristic) and adhesion.

5 Claims, No Drawings

POLYIMIDE FILM AND METHOD OF MANUFACTURE THEREOF

TECHNICAL FIELD

The present invention pertains to a polyimide film with excellent passage characteristic in an automatic optical inspection system (AOI) and its manufacturing method.

BACKGROUND OF THE INVENTION

It is known that the polyimide film has excellent characteristics in heat resistance, cold resistance, chemical resistance, electric insulation, mechanical strength, etc., and the polyimide film is broadly utilized in electric insulating material of electric wires, adiabatic material, base film of flexible printed-circuit boards (FPC), carrier tape film for tape automated bonding (TAB) of IC, tape for fixing lead frames of IC, etc. Among them, in the usages such as FPC, carrier tape for TAB, and tape for fixing leads, the polyimide film and a copper foil are usually adhered via various adhesives.

An important practical characteristic of the polyimide film, which is required for these usages, is a slip characteristic (easy slip characteristic) of said film. However, in reality, a sufficiently satisfactory slip characteristic in the automatic optical inspection system (AOI) cannot be provided.

In other words, in various film working processes, it has been known that the operability and the handling characteristic are improved by securing the easy slip characteristic of a film support (for example, roll) and a film or the easy slip characteristic of films, so that the generation of inferior portions such as folds on the film can be avoided. On the other hand, in a flexible printed-circuit board as the main usage of the polyimide, the polyimide is usually adhered to a copper foil via various kinds of adhesives, and the adhesion of the polyimide with the copper foil is insufficient in terms of its chemical structure and chemical resistance (solvent stability) in many cases. It is known that the polyimide is adhered after a surface treatment (alkali treatment, corona treatment, plasma treatment, sandblast treatment, etc.).

However, in the fine pitch formation of recent electronic components, the inspection of line width, foreign matters, etc., with the naked eyes has been mainly carried out especially in the inspection of FPC. However, after the introduction of the automatic optical inspection system (AOI), even if a sufficiently satisfactory running characteristic is obtained in heat-resistant films of this conventional technical method, inorganic powders are too large in the AOI, so that said inorganic powders are considered as foreign matters in comparison with the recent narrow pitch formation of FPC, etc., causing a large obstacle to the automatic optical inspection system.

Known specifically as conventional easy slipping techniques in the polyimide are, for example, a method that adds an inactive inorganic compound (for example, orthophosphate of alkaline-earth metals, calcium secondary phosphate anhydride, calcium pyrophosphate, silica, and talc) to polyamic acid (see patent reference 1), and a method that makes many projections consisting of inorganic particles, in which part of inorganic particles with an average particle diameter of 0.01-100 μm are embedded and held in a polyimide surface layer and partially exposed, exist at $1 \times 10$-$5 \times 10^8$ pieces/mm$^2$ on the surface layer of said film (see patent reference 2). In this method, the friction coefficient of the film surface is lowered by aggressively exposing the projections to the surface, so that an easy slip effect is effectively obtained. However, in this method, since the inorganic particles are partially exposed, scratches are generated on the film surface, causing appearance inferiority, and in the automatic optical inspection system, the particle diameter is too large, so that the particles are considered as foreign matters. In this technique using inorganic particles, fillers are lost when holes are opened by laser, etc., leading to a lowered working precision.

In addition, also known as another technique is a polyimide film (patent reference 3) in which total aromatic polyimide particles with a median diameter of 0.3-0.8 μm and a maximum diameter of 2 μm or smaller composed of polyimide containing 80% or more pyromellitic acid and p-phenylenediamine components are dispersed at a ratio of about 0.5-10 mass % to the polyimide of a polyimide surface layer into said polyimide surface layer of 1 μm. However, in this technique, the particle diameter is too large in both the average particle diameter and the median diameter, so that the polyimide particles are considered as foreign matters in a test of the automatic optical inspection system (AOI), and if the polyimide particles are dispersed into only the surface layer of 1 μm, the cohesion of the particles is likely to be caused, which is not preferable.

DESCRIPTION OF PRIOR ART

Patent reference 1: Japanese Kokai Patent Application No. Sho 62[1987]-68852
Patent reference 2: Japanese Kokai Patent Application No. Hei 5[1993]-25295
Patent reference 3: Japanese Kokai Patent Application No. 2005-126707

As a result of earnest researches of these market demands, the purpose of the present invention is to provide a polyimide film with excellent passage characteristic, especially in an automatic optical inspection system (AOI), not to mention running characteristic (easy slip characteristic).

MEANS TO SOLVE THE PROBLEMS

In order to solve these problems, the present invention adopts the following means. The polyimide film of the present invention comprising 0.10-3.0 wt % polyimide particles with a particle diameter of 100-250 nm. The film has fine projections on the surface of the film. Preferably, polyimide particles have a diameter of 100-200 nm.

A method for manufacturing the polyimide film comprises dispersing 0.10-3.0 wt % polyimide particles with a particle diameter of 100-250 nm in to a polyamic acid solution. The solution is cast on to a support and imidized. In another embodiment, the polyimide particles are dispersed into a polar solvent before adding to the polyamic acid solution. In another embodiment, the method of manufacturing polyimide film comprises dispersing the polyimide particles with a particle diameter of 100-200 nm in to a polyamic acid solution.

EFFECTS OF THE INVENTION

According to the present invention, a polyimide film with excellent passage characteristic, especially in the automatic optical inspection system (AOI), can be provided, so that the adhesion with a copper foil is markedly improved and the easy slip characteristic and the mechanical properties are also excellent. Therefore, this polyimide film can be suitably used for flexible printed-circuit boards and chip-on films (COF).

PREFERRED EMBODIMENT OF THE INVENTION

In the present invention, in order to achieve a polyimide film with excellent passage characteristic in the automatic optical inspection system (AOI), these problems were reviewed in earnest. As a result, it was clarified that when a specific amount of polyimide particles with a specific particle diameter was mixed and dispersed at the stage of a polyimide precursor, the above-mentioned problems were unexpectedly solved at a time.

In other words, in the present invention, as for the passage characteristic in the automatic optical inspection system (AOI), the fact that particles were considered as foreign matters was reviewed in earnest. As a result, in the conventional dispersion and inclusion technique of inorganic particles, there were drawbacks such as exposure and loss of the inorganic particles. Especially the decision with regard to foreign matter was further reviewed. As a result, it was discovered that when the same material was adopted as particles and formed into a fine particle shape with a specific particle diameter, the above-mentioned passage characteristic was successfully, stably achieved. In other words, the characteristic of the polyimide film of the present invention is that the polyimide particles composed of the same material are used.

However, if the particles are simply too fine, the running characteristic (easy slip characteristic) and the adhesion will be inferior, so it is important to limit the particle diameter to a specific range to simultaneously meet these excellent functions.

In addition, it is important for the polyimide film to have industrial practicality, and the content of these particles is involved in satisfying these mechanical properties. If the particles are too large, the mechanical properties will be lost, so it is in demand that its content be limited.

That is, for the above reasons, the technical concept of the present invention adopts the following constitution.

In other words, the polyimide film of the present invention comprises 0.10-3.0 wt % polyimide particles with a particle diameter of 100-250 nm and said film having fine projections on the surface of said film.

Here, the polyimide of the present invention, for example, can be obtained by mixing aromatic tetracarboxylic dianhydride, aromatic diamine or polyamic acid mainly composed of both of them and a dehydrating cyclizing reagent mainly composed of acetic anhydride, pre-drying it, and applying a chemical conversion for simultaneously advancing desolvation and imide ring closure by heating to high temperature to it.

As the acid dianhydride, pyromellitic acid, 3,3',4,4'-biphenyltetracarboxylic acid, 2,3'3,4'-biphenyltetracarboxylic acid, 3,3',4,4'-benzophenonetetracarboxylic acid, 2,3,6,7-naphthalenedicarboxylic acid, 2,2-bis(3,4-dicarboxyphenyl) ether, pyridine-2,3,5,6-tetracarboxylic acid, and these amide formative derivatives can be used.

Moreover, as the above-mentioned diamine, paraphenylenediamine, metaphenylenediamine, benzidine, paraxylylenediamine, 4,4'-diaminodiphenyl ether, 3,4'-diaminodiphenyl ether, 4,4'-diaminodiphenylmethane, 4,4'-diaminodiphenylsulfone, 3,3'-dimethyl-4,4'-diaminodiphenylmethane, 1,5-diaminonaphthalene, 3,3'-dimethoxybenzidine, 1,4-bis(3-methyl-5-aminophenyl)benzene, and these amide formative derivatives can be used.

Furthermore, these acid dianhydride components and diamine components or a polyamic acid solution composed of the above-mentioned polyamic acid are mixed with the dehydrating cyclizing reagent such as acetic anhydride and heated.

This solvent solution is pre-dried, heated to high temperature, and subjected to simultaneous desolvation and imide ring closure to chemically convert it, and the solvent solution is changed to a varnish-state polyamic acid by an addition polymerization in a polar solvent and heated. The varnish-state polyimide solution obtained is maintained in a solution state. However, it was clarified that the mixed and dispersed polyimide particles were not originally involved in this chemical reaction but maintained the original particle state, and it was successfully discovered that if the polyimide solution was formed into a film by further heating, fine projections resulting from said polyimide particles were formed on the surface of said film.

In other words, the polyimide film can be manufactured by casting said polyimide solution on a support, heating it to high temperature on the support, and chemically converting it through desolvation and imide ring closure.

The imidization rate of the polyimide particles used in the present invention is not particularly limited, however the imidization rate is preferably 50% or more, more preferably 70% or more.

As a result, the polyimide film with excellent passage characteristic, especially in the automatic optical inspection system (AOI), not to mention the above-mentioned effects, that is, the running characteristic (easy slip characteristic) and the adhesion, can be provided.

The above-mentioned polyamic acid solution is reacted with the dehydrating cyclizing reagent, and the imide rings are completely or partially closed while maintaining its varnish state to form a varnish-state polyimide solution. This polyimide solution is further heated to high temperature and subjected to the desolvation and the imide ring closure on said support, so that a film can be prepared.

In this polyimide film, it is important for the above-mentioned polyimide particles, which are added and mixed, to be set in a range of a particle diameter of 100-250 nm. If the particle diameter is smaller than 100 nm, the running characteristic (easy slip characteristic) and the adhesion will be inferior. On the contrary, if the particle diameter is greater than 250 nm, the passage characteristic in the automatic optical inspection system (AOI) will be inferior. Preferably, the average particle diameter is 100-200 nm.

In addition, it is important for the polyimide particles with the above-mentioned specific particle diameter to be mixed, dispersed, and included in a range of 0.1-3.0 wt % into said polyimide film. If the content of these polyimide particles is less than 0.1 wt %, fine projections will be difficult to be formed. On the contrary, if the content is more than 3.0 wt %, the mechanical properties will be inferior, causing an inferiority in the industrial practicality.

Next, the method for manufacturing this polyimide film will be explained.

The point of this manufacturing method is that the above-mentioned polyimide particles should be mixed and included at a certain stage of the manufacture of the polyimide film. In the present invention, as mentioned above, since said polyimide particles are not involved in chemical reactions such as imide ring closure and chemical conversion but can be stable in a solution and physically stable and can maintain the original particle state, they can be mixed, included, and dispersed from the stage of a polyimide precursor, that is, a raw material solvent solution such as polyamic acid.

Therefore, first, the polyimide particles with a particle diameter of 100-250 nm are added in a range of 0.10-3.0 wt % to the polyamic acid solution. In this case, as mentioned above, a slurry state in which the polyimide particles are mixed and dispersed by an acid dianhydride component and a diamine component or a polar solvent as that of a polyamic acid solution composed of the above-mentioned polyamic acid is preferably used. This silica slurry has advantages in which the cohesion is prevented, the precipitation rate is slow and stable owing to its very small particle diameter, and even if the particles are precipitated, they can be easily re-dispersed by re-stirring.

The slurry of these polyimide particles is formed by casting said polyamic acid solution in a film shape on a support, pre-drying it, heating it to high temperature, and subjecting it to imidization by chemically cyclizing. Preferably, the polyimide particles have an average particle diameter of 100-200 nm in terms of function effects for the same reasons as the above-mentioned ones. In other words, a polyimide film with excellent passage characteristic in the automatic optical inspection system (AOI) as well as excellent running characteristic (easy slip characteristic) and adhesion is preferably manufactured.

The above-mentioned varnish-state polyamic acid solution obtained by further mixing with a dehydrating cyclizing reagent and heating is further pre-dried, heated to high temperature, and imidized by chemically cyclizing to obtain a varnish-state polyimide solution. At the stage of the above-mentioned varnish-state solution, it can be cast on the support, dried and heated to high temperature in this state, and chemically converted to simultaneously advance the desolvation and the imide ring closure, so that the imide rings can be further completely closed and formed into a film.

The characteristic of the polyimide film obtained in this manner is that fine projections resulting from the above-mentioned specific polyimide particles mixed and dispersed are formed.

Since the thickness of this polyimide film is usually 7.5-125 μm, the above-mentioned polyimide particles are not exposed to the surface.

EXAMPLES

Next, the present invention will be explained using application examples.

The measurement methods in the present invention will be explained below.
(a) Static Friction Coefficient It was measured according to JIS K7125. Specifically, it was measured by repeatedly rubbing the surface and the back surface of the film.
(b) The Adhesion Evaluation Method The adhesion was measured according to IPC-FC-241. Specifically, the polyimide film and a copper foil were adhered with a thermoplastic polyimide adhesive [available] on the market, and the film was fixed onto a hard plate and measured.
(c) Automatic Optical Inspection (AOI)

Using SK-75 made by Orbotech Co, foreign matters were determined and inspected.
(d) Particle Size Distribution Using SALD-2000J made by Shimadzu Corporation, the polyimide particles dispersed into a polar solvent were measured as a sample.
(e) Measurement of Surface Roughness The surface roughness of the sample film was measured by a laser microscope manufactured by Laser Tech Co.
(f) Mechanical Strength of Film (Tensile Strength and Stretch)

It was measured according to ASTM D-882-68. Specifically, an autograph device was used for the measurement.

Application Example 1

24.03 [g] (120 mmol) 4,4'-diaminediphenyl ether (hereinafter, called 4,4'-ODA) was put into 300 mL well dried separable flask, and 184.8 g dimethylacetamide (hereinafter, called DMAc) was added to it. The 4,4'-ODA was dissolved in a nitrogen air flow via a rotary blade made of poly(tetrafluoroethylene) by a chemical stirrer.

Next, 25.39 g (97 mmol % to 4,4'-ODA) pyromellitic dianhydride (hereinafter, called PMDA) was added to it to obtain a prepolymer.

FS (6 wt % DMAc solution of PMDA) was then slowly added, and when the reaction mixture exceeded 2,000 poise, the polymerization reaction was completed, and a polymer solution composed of 20.3 wt % varnish-state polyamic acid solution was obtained.

0.1 wt % N,N-dimethylacetamide slurry of polyimide particles with an average particle of 200 nm, from which a particle diameter of 100-250 nm or greater was excluded, to the resin weight was added to the above-mentioned varnish-state polyamic acid solution and sufficiently stirred and dispersed. The polymer solution composed of the varnish-state polyamic acid solution was cast in a film shape on a support and peeled off from the support, and its conversion reaction into an imide was completed. At the same time, it was dried and heat-treated by passing through a drying heat treatment zone at 250-450° C. and rolled as a polyimide film with a thickness of 25 μm on a roll.

Application Example 2

A polyimide film with a thickness of 25 μm was obtained by a method similar to that of Application Example 1 except for changing the amount of addition of the polyimide particles to 0.5 wt %.

Application Example 3

A polyimide film with a thickness of 25 μm was obtained by a method similar to that of Application Example 1 except for changing the amount of addition of the polyimide particles to 0.80 wt %.

Comparative Example 1

A polyimide film with a thickness of 25 μm was obtained similarly to Application Example 1 except for not adding the polyimide particles.

Comparative Example 2

A polyimide film with a thickness of 25 μm was obtained by the same method as that of Comparative Example 1 after adding 0.15 wt % secondary calcium phosphate ($Ca_2HPO_4$) with an average particle diameter of 2.5 μm, from which smaller than 1,000 nm and 5,000 nm or greater were excluded in the particle diameter, to the film resin weight to the varnish-state polyamic acid solution obtained by the same method as that of Comparative Example 1 and sufficiently stirring and dispersing them.

Comparative Example 3

A polyimide film with a thickness of 25 μm was obtained by the same method as that of Comparative Example 1 after adding 0.08 wt % polyimide particles by the method of Application Example 1.

Comparative Example 4

A polyimide film with a thickness of 25 μm was obtained by the same method as that of Comparative Example 1 after adding 3.5 wt % polyimide particles by the method of Application Example 1.

Comparative Example 5

A polyimide film with a thickness of 25 μm was obtained by the same method as that of Comparative Example 1 after adding 0.5 wt % polyimide particles with an average particle diameter of 100 nm and a particle diameter in a range of 50-150 nm by the method of Application Example 1.

Comparative Example 6

A polyimide film with a thickness of 25 μm was obtained by the same method as that of Comparative Example 1 after adding 0.5 wt % polyimide particles with an average particle diameter of 1,000 nm and a particle diameter in a range of 800-1,200 nm by the method of Application Example 1.

In Application Examples 1-3 and Comparative Examples 1-4, the mechanical properties, the static friction coefficient, and the adhesion of the polyimide films obtained and the evaluation results of the automatic optical inspection system are shown in Table 1.

Table 1

As seen from the results of Table 1, the polyimide films of the present invention in which the polyimide particle slurry with a particle diameter of mainly 100-250 nm was included at 1.0-3.0 wt % to the film resin were suitable for a wide field of applications such as flexible printed-wiring boards and chip-on films (COF) that hold excellent easy slip characteristic, AOI, and mechanical properties.

INDUSTRIAL APPLICABILITY

According to the present invention, a polyimide film with excellent passage characteristic, especially in an automatic optical inspection system (AOI), can be provided, and a polyimide film with excellent adhesion, easy slip characteristic, and mechanical properties can also be provided. Therefore, this polyimide film can be suitably utilized especially in flexible printed-circuit boards and chip-on films (COF).

Solution Means

The polyimide film of the present invention comprising 0.10-3.0 wt % polyimide particles with a particle diameter of 100-250 nm and said film having fine projections on the surface of said film.

A method for manufacturing a polyimide film comprising, dispersing 0.10-3.0 wt % polyimide particles with a particle diameter of 100-250 nm in to a polyamic acid solution, casting the filled polyamic acid solution on to a support and imidizing.

TABLE 1

| | Kind of particle | Amount of particles added (wt %) | Average particle diameter (nm) | Range of particle system (nm) | Static friction coefficient | AOI | Mechanical strength (MPa) | Adhesive strength (N/cm) |
|---|---|---|---|---|---|---|---|---|
| Application Example 1 | Polyimide particles | 0.10 | 200 | 100-250 | 0.81 | excellent | 327 | 17 |
| Application Example 2 | Polyimide particles | 0.50 | 200 | 100-250 | 0.66 | excellent | 330 | 20 |
| Application Example 3 | Polyimide particles | 0.80 | 200 | 100-250 | 0.51 | excellent | 328 | 22 |
| Comparative Example 1 | | 0 | — | — | 2.27 | excellent | 330 | 10 |
| Comparative Example 2 | Ca2HPO4 | 0.15 | 2500 | 1000-5000 | 0.49 | Not good | 321 | 20 |
| Comparative Example 3 | Ca2HPO5 | 0.50 | 2500 | 1000-5000 | 0.25 | Not good | 160 | 22 |
| Comparative Example 3 | Polyimide particles | 0.08 | 200 | 100-250 | 1.80 | excellent | 321 | 12 |
| Comparative Example 4 | Polyimide particles | 3.5 | 200 | 100-250 | 0.39 | Not good | 305 | 22 |
| Comparative Example 5 | Polyimide particles | 0.50 | 100 | 50-150 | 0.80 | excellent | 328 | 22 |
| Comparative Example 6 | Polyimide particles | 0.50 | 1000 | 800-1200 | 0.6 | excellent | 320 | 20 |

What is claimed is:

1. A polyimide film comprising 0.10-3.0 wt % polyimide particles with a particle diameter of 100-250 nm and said film having fine projections on the surface of said film.

2. The polyimide film of claim 1, wherein said polyimide particles have a average diameter of 100-200 nm.

3. A method for manufacturing a polyimide film comprising, dispersing 0.10-3.0 wt % polyimide particles with a particle diameter of 100-250 nm in to a polyamic acid solution; casting the filled polyamic acid solution on to a support; and imidizing.

4. The method for manufacturing a polyimide film of claim 3, wherein said polyimide particles are dispersed into a polar solvent before adding to said polyamic acid solution.

5. The method for manufacturing a polyimide film in accordance with claim 3 or 4, wherein said polyimide particles have a diameter of 100-200 nm.

* * * * *